United States Patent
Song et al.

(10) Patent No.: US 7,439,094 B2
(45) Date of Patent: Oct. 21, 2008

(54) METHOD OF MANUFACTURING A SEMICONDUCTOR PACKAGE

(75) Inventors: Moon Koog Song, Kyungki-Do (KR); Dong Hwan Kim, Seoul (KR); Jin Mun Ryu, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/769,489

(22) Filed: Jun. 27, 2007

(65) Prior Publication Data

US 2007/0249095 A1 Oct. 25, 2007

Related U.S. Application Data

(62) Division of application No. 11/296,300, filed on Dec. 8, 2005, now abandoned.

(30) Foreign Application Priority Data

Jan. 28, 2005 (KR) ............... 10-2005-8224

(51) Int. Cl.
*H01L 21/00* (2006.01)
(52) U.S. Cl. ............... 438/55; 438/50; 438/57; 257/434; 257/433; 257/432; 257/E31.12
(58) Field of Classification Search ............ 438/48–64, 438/460–464; 257/432–434, E31.12
See application file for complete search history.

(56) References Cited

U.S. PATENT DOCUMENTS

2004/0130640 A1 7/2004 Fujimori
2004/0266051 A1* 12/2004 Kojima et al. ............... 438/57

(Continued)

FOREIGN PATENT DOCUMENTS

EP 1 408 547 A2 4/2004

(Continued)

OTHER PUBLICATIONS

Office Action from the Korean Intellectual Property Office mailed May 15, 2006.

(Continued)

*Primary Examiner*—Dung A. Le
(74) *Attorney, Agent, or Firm*—Lowe Hauptman Ham & Berner

(57) ABSTRACT

Disclosed herein are a semiconductor package used in digital optical instruments and a method of manufacturing the same. The semiconductor package comprises a wafer made of a silicon material and having pad electrodes formed at one side surface thereof, an IR filter attached on the pad electrodes of the wafer by means of a bonding agent, terminals electrically connected to the pad electrodes, respectively, in via holes formed at the other side surface of the wafer, which is opposite to the pad electrodes, and bump electrodes, each of which is connected to one side of each of the terminals. The present invention is capable of minimizing the size of a semiconductor package having an image sensor, which is referred to as a complementary metal oxide semiconductor (CMOS) or a charge coupled device (CCD), through the application of a wafer level package technology, thereby reducing the manufacturing costs of the semiconductor package and accomplishing production on a large scale.

16 Claims, 18 Drawing Sheets

U.S. PATENT DOCUMENTS

2005/0024752 A1    2/2005    Webster
2006/0043569 A1    3/2006    Benson et al.

FOREIGN PATENT DOCUMENTS

| | | |
|---|---|---|
| JP | 2004-111792 A | 4/2004 |
| JP | 2004-153260 | 5/2004 |
| JP | 2004-153260 A | 5/2004 |
| KR | 2004-54525 | 6/2004 |
| WO | 99-40624 A1 | 8/1999 |
| WO | 01-43181 A1 | 6/2001 |

OTHER PUBLICATIONS

Office Action from the European Patent Office mailed May 19, 2006.

\* cited by examiner (a)

(b)

(a)

(b)

(a)

(b)

(a)

(b)

(a)

(b)

METHOD OF MANUFACTURING A SEMICONDUCTOR PACKAGE

RELATED APPLICATIONS

The present application is a division of U.S. application Ser. No. 11/296,300, filed Dec. 8, 2005, now abandoned, which claims priority from, Korea Application Number 10-2005-0008224, filed Jan. 28, 2005, the disclosures of which are hereby incorporated by reference herein in their entirety.

BACKGROUND OF THE INVENTION

1. Field of the Invention

The present invention relates to a semiconductor package used in digital optical instruments and a method of manufacturing the same, and more particularly to a semiconductor package used in digital optical instruments and a method of manufacturing the same that is capable of minimizing the size of a semiconductor package having an image sensor, which is referred to as a complementary metal oxide semiconductor (CMOS) or a charge coupled device (CCD), through the application of a wafer level package technology, thereby reducing the manufacturing costs of the semiconductor package and accomplishing production on a large scale.

2. Description of the Related Art

Recently, portable home video cameras and digital cameras have been miniaturized. Furthermore, camera units have been incorporated into portable mobile phones. As a result, subminiature and high-resolution image sensor modules have been increasingly required. Such image sensor modules are composed of semiconductor packages, which must have an increased number of pixels because consumers desire excellent color reproduction and detailed expression and which must be light, thin, short, and small in addition to high density because the image sensor modules are applied to potable mobile phones.

FIG. 1A is a perspective view of a conventional semiconductor package 300 constituting an image sensor module illustrating the front part of the conventional semiconductor package 300. The illustrated conventional semiconductor package 300 has a basic structure. Specifically, an image sensor or a light-receiving part 305 is formed on a silicon substrate, and a plurality of aluminum pads 310 are disposed around the image sensor or the light-receiving part 305. FIG. 1B is a perspective view of the conventional semiconductor package 300 illustrating the rear part of conventional semiconductor package 300.

Such a conventional semiconductor package 300 is generally applied to a camera module for mobile phones in one of three modes, such as a chip-on-board (COB) mode using a gold wire bonding technology, a chip-on-FPC (COF) mode using anisotropic conductive film (ACF) or non-conductive paste (NCP), and a chip-on-package (CSP) mode. Among the three modes, the CSP mode is widely used because the size of the semiconductor package manufactured in the CSP mode is very small, and the CSP mode is suitable for mass production.

CSP package structures and methods of manufacturing the same are well known. For example, the image sensor is mainly manufactured in a SHELL-OPC mode developed by Shellcase Ltd., which is one of the wafer level CSP modes.

FIGS. 2A, 2B, and 2C illustrate the structure of a conventional semiconductor package 350 manufactured in the above-mentioned SHELL-OPC mode. The conventional semiconductor package 350 is disclosed in International Patent Publication No. WO 99/40624. The semiconductor package 350 has a relatively thin and dense structure, which is protected from the external environment and is mechanically reinforced. A plurality of electric contacts 362 are plated along edge surfaces 364.

The contacts 362 extend onto a flat surface 366 of the semiconductor package 350 via the edge surfaces 364. Through this arrangement of the contacts 362, the flat surface 366 of the semiconductor package 350 and the edge surfaces 364 can be attached to a circuit board. The conventional semiconductor package 350 has fusion bumps 367 formed at the ends of the respective contacts 362. The fusion bumps 367 are arranged in a predetermined pattern.

FIG. 3 is a longitudinal sectional view illustrating the structure of another conventional semiconductor package 400 similar to the above-described semiconductor package. The conventional semiconductor package 400 is also disclosed in International Patent Publication No. WO 99/40624. The semiconductor package 400 includes a light-emitting unit and/or a light-receiving unit. The upper and lower surfaces of the semiconductor package 400 are formed of an electrically insulating and mechanical protecting material. At the upper surface and/or the lower surface of the semiconductor package 400 is disposed an integrated circuit die 422, a transparent protective film 407 of which transmits light and electrically insulating edge surfaces 414 of which have pads.

The conventional semiconductor package 400 has a plurality of electric contacts 432 along the edge surfaces 414. The conventional semiconductor package 400 also has a selective filter and/or a reflection-preventing coating film 445 formed at an outer adhesion surface 406 of the protective film 407.

FIG. 4 is a longitudinal sectional view illustrating the structure of another conventional semiconductor package 450, which is disclosed in International Patent Publication No. WO 01/43181. The conventional semiconductor package 450 includes a micro lens array 460 formed at a crystalline silicon substrate 462. Below the silicon substrate 462 is disposed a package layer 466, which is generally formed of glass. The package layer 466 is sealed by epoxy resin 464. Electric contacts 478 are formed along the edge of the package layer 466. Bumps 480 are normally formed by the electric contacts 478. The electric contacts 478 are connected to the silicon substrate 462 by conductive pads 482.

The conventional semiconductor package 450 is constructed such that a glass layer 494 and related spacer elements 486 are disposed on the silicon substrate 462 while being sealed by a bonding agent, such as epoxy resin 488, and therefore, a space 496 is formed between the micro lens array 460 and the glass layer 494. Preferably, the package layer 466 is transparent.

However, the structures of the above-described conventional semiconductor packages 400 and 450 are very complicated, and therefore, it is very difficult to manufacture the conventional semiconductor packages 400 and 450.

FIG. 5 is a longitudinal sectional view illustrating the structure of another conventional semiconductor package 500, which is manufactured in a mode different from the above-mentioned modes. The conventional semiconductor package 500 is disclosed in Japanese Patent Application No. 2002-274807. A transparent adhesion layer 508 is attached to a glass substrate 509 having a size corresponding to a plurality of semiconductor packages. Above the transparent adhesion layer 508 is disposed a silicon substrate 501 having a photoelectric conversion device region 502 formed at the lower surface thereof while a gap is formed between the silicon substrate 501 and the transparent adhesion layer 508. In the illustrated structure, connection wires 507 are connected to a connection pad 503 of the silicon substrate 501 in the vicinity of the lower surface of the silicon substrate 501.

After an insulation film 506, rewiring layers 511, columnar electrodes 512, a packaging film 513, and welding balls 514 are formed, the silicon substrate 501 is cut into pieces, and therefore, a plurality of semiconductor packages 500 each having the photoelectric conversion device region 502 are obtained. However, the structure of this conventional semiconductor packages 500 is very complicated, and therefore, it is very difficult to manufacture the conventional semiconductor package 500.

FIG. 6 is a longitudinal sectional view illustrating the structure of yet another conventional semiconductor package 600, which is different from the above-described conventional semiconductor packages. The conventional semiconductor package 600 is disclosed in Japanese Unexamined Patent Publication No. 2004-153260. The conventional semiconductor package 600 includes a pad electrode 611 formed on a semiconductor tip 610, a supporting plate 613 attached to the surface of the semiconductor tip 610, a via hole 617 formed from the inside surface of the semiconductor tip 610 to the outside surface of the pad electrode 611, and a columnar terminal 620 connected to the pad electrode 611 in the via hole 617.

At the columnar terminal 620 is formed a rewiring layer 621, on which a solder mask 622 is coated. A bump electrode 623 is electrically connected to the rewiring layer 621.

In the conventional semiconductor package 600 having the above-stated peculiar structure, wire breaking or deterioration of step coverage is effectively prevented, and therefore, the reliability of the conventional semiconductor package 600 having a ball grid array is increased.

However, the wavelength of light received by the above-mentioned semiconductor packages constituting the image sensor modules includes a visible spectrum, in which persons can see and recognize objects, in addition to an infrared spectrum and an ultraviolet spectrum.

For this reason, a camera module, in which the semiconductor package is mounted, has an infrared (IR) filter, by which infrared light transmissivity is decreased. Since the light in the infrared spectrum includes heat, the infrared light transmissivity is decreased and the reflexibility is increased by the IR filter, and therefore, the image sensor, which receives the light, is protected, and the transmissivity in the visible spectrum is increased.

According to the conventional art, a rectangular glass sheet is IR coated and is then cut into a plurality of IR filters, each of which is attached to the semiconductor package.

In this way, the semiconductor package is mounted to the camera module while the IR filter is separately attached to the semiconductor package according to the conventional art. That is, the conventional process is complicated, and therefore, improvement to the conventional process is required.

SUMMARY OF THE INVENTION

Therefore, the present invention has been made in view of the above problems, and it is an object of the present invention to provide a semiconductor package and a method of manufacturing the same that is capable of minimizing the size of the camera module and performing a packaging process at the wafer level step, thereby accomplishing mass production of the semiconductor package and reducing the manufacturing costs of the semiconductor package.

It is another object of the present invention to provide a semiconductor package and a method of manufacturing the same that is easily mounted through a reflow process, which is a conventional mounting process, at the step of mounting the semiconductor package on a printed circuit board (PCB), thereby improving assembly efficiency of the camera module.

It is yet another object of the present invention to provide a semiconductor package and a method of manufacturing the same that is capable of remarkably shortening a manufacturing process in chip-on-package (CSP) mode and not requiring attachment of an additional infrared (IR) filter to the camera module, thereby improving a manufacturing process of the semiconductor package and increasing productivity of the semiconductor package.

In accordance with one aspect of the present invention, the above and other objects can be accomplished by the provision of a semiconductor package used in digital instruments, the package comprising: a wafer made of a silicon material, the wafer having pad electrodes formed at one side surface thereof; an IR filter attached on the pad electrodes of the wafer by means of a bonding agent; terminals electrically connected to the pad electrodes, respectively, in via holes formed at the other side surface of the wafer, which is opposite to the pad electrodes; and bump electrodes, each of which is connected to one side of each of the terminals.

In accordance with another aspect of the present invention, there is provided 5. A method of manufacturing a semiconductor package used in digital instruments, the method comprising the steps of: bonding an IR filter to a wafer, which has the pad electrodes formed at one side surface thereof and is made of a silicon material; removing the rear part of the wafer by cutting the rear part of the wafer such that the sum of the thickness of the wafer and the thickness of the IR filter is within the initial thickness of the wafer; forming via holes through the wafer from the rear surface of the wafer to the pad electrodes; forming terminals electrically connected to the pad electrodes in the via holes; forming bump electrodes on the terminals, respectively; and cutting the wafer into a plurality of semiconductor packages.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B illustrate the structure of a conventional semiconductor package, wherein FIG. 1A is a perspective view of the conventional semiconductor package illustrating the front part of the conventional semiconductor package, and FIG. 1B is a perspective view of the conventional semiconductor package illustrating the rear part of the conventional semiconductor package;

FIGS. 2A, 2B, and 2C illustrate the structure of another conventional semiconductor package, wherein FIG. 2A is a perspective view of the conventional semiconductor package illustrating the front part of the conventional semiconductor package, FIG. 2B is a perspective view of the conventional semiconductor package illustrating the rear part of the conventional semiconductor package, and FIG. 2C is a perspective view of the conventional semiconductor package illustrating bump electrodes formed at the rear part of the conventional semiconductor package;

FIGS. 7A, 7B, and 7C illustrate the structure of a semiconductor package according to the present invention, wherein FIG. 7A is a perspective view of the semiconductor package illustrating the front part of the semiconductor package, FIG. 7B is a perspective view of the semiconductor package illustrating the rear part of the semiconductor package, and FIG. 7C is a longitudinal sectional view of the semiconductor package illustrating an infrared (IR) filter and bump electrodes formed at the rear and front parts of the semiconductor package, respectively;

FIGS. 8A and 8B illustrate a semiconductor package manufacturing method according to the present invention, wherein FIG. 8A is a view illustrating the structure of an IR filter glass layer, and FIG. 8B is a sectional view illustrating a step of attaching the IR filter glass layer to a wafer;

FIGS. 10A and 10B illustrate via holes formed at the rear part of the wafer according to the present invention, wherein FIG. 10A is a sectional view illustrating blind via holes, and FIG. 10B is a sectional view illustrating through via holes;

FIGS. 11A and 11B illustrate terminals formed at the rear part of the wafer according to the present invention, wherein FIG. 11A is a sectional view illustrating the terminals formed at the rear part of the wafer in the case of the blind via holes, and FIG. 11B is a sectional view illustrating the terminals formed at the rear part of the wafer in the case of the through via holes;

FIGS. 12A and 12B illustrate conductive paste filled in the via holes according to the present invention, wherein FIG. 12A is a sectional view illustrating the conductive paste filled in the blind via holes, and FIG. 12B is a sectional view illustrating the conductive paste filled in the through via holes;

FIGS. 13A, 13B, 13C, and 13D illustrate photosensitive resist applied on the terminals according to the present invention, wherein FIG. 13A is a sectional view illustrating liquid-state photosensitive resist applied on the terminals in the case of the blind via holes, FIG. 13B is a sectional view illustrating liquid-state photosensitive resist applied on the terminals in the case of the through via holes, FIG. 13C is a sectional view illustrating photosensitive film resist applied on the terminals in the case of the blind via holes, FIG. 13D is a sectional view illustrating photosensitive film resist applied on the terminals in the case of the through via holes;

FIGS. 14A and 14B illustrate via holes, interiors of which are filled according to the present invention, wherein FIG. 14A is a sectional view illustrating the via holes, interiors of which are filled with resin, and FIG. 14B is a sectional view illustrating the via holes, interiors of which are filled with conductive paste;

FIGS. 16A and 16B illustrate semiconductor packages manufactured in the form of a wafer and cut into pieces according to the present invention, wherein FIG. 16A is a view illustrating the structure of the wafer, and FIG. 16B is a view illustrating, in detail, the structure of the semiconductor package.

DESCRIPTION OF THE PREFERRED EMBODIMENTS

Now, preferred embodiments of the present invention will be described in detail with reference to the accompanying drawings.

Figure 1:
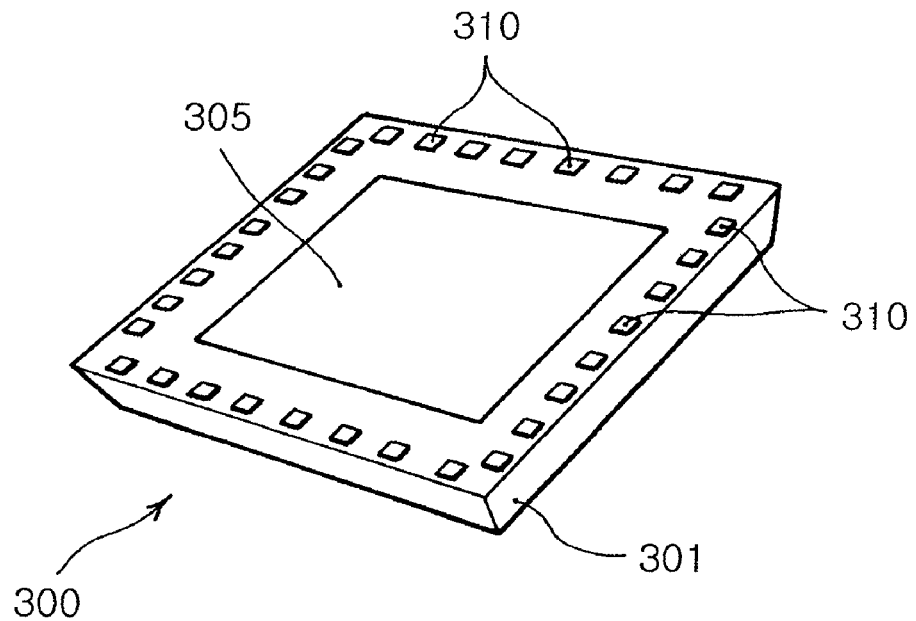
Figure 1:
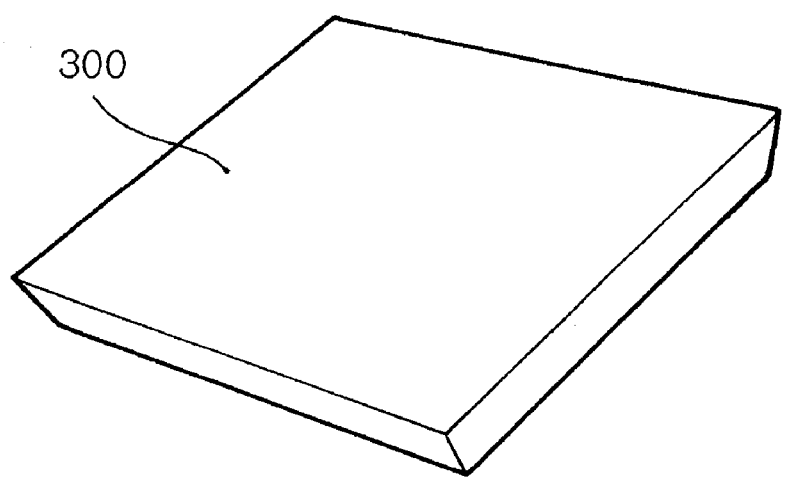
Figure 2:
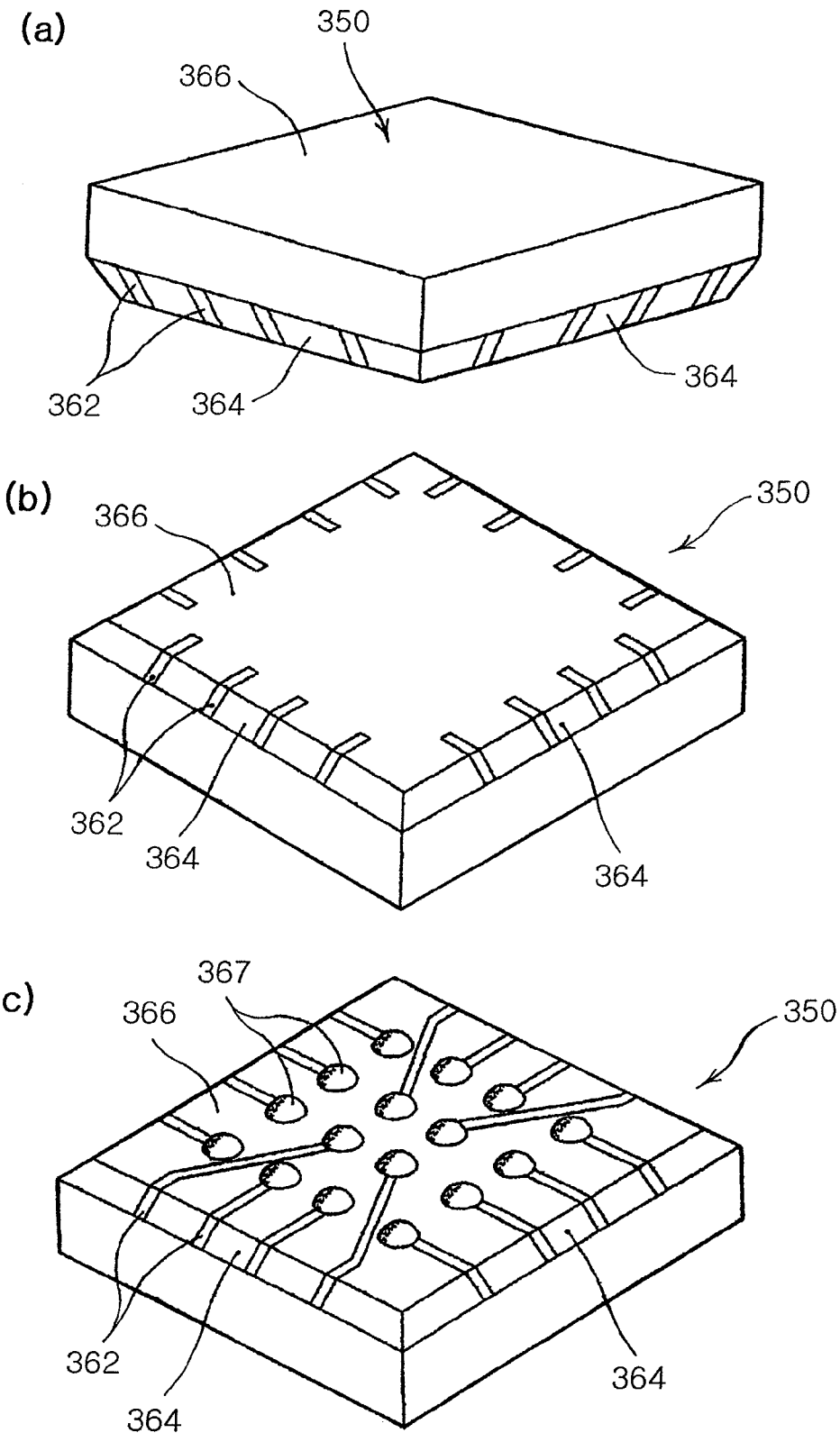
Figure 3:
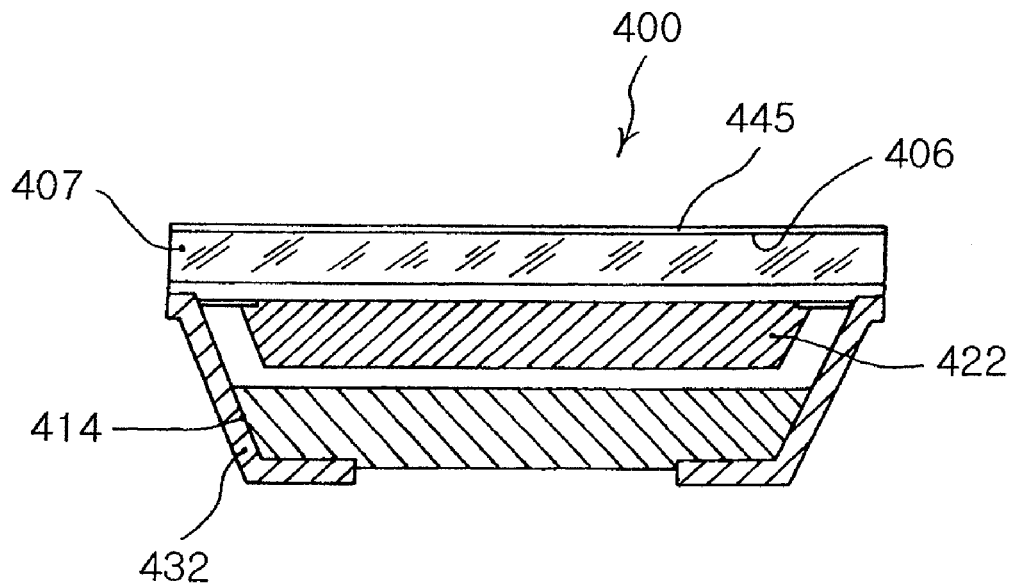
FIG. 3 is a longitudinal sectional view illustrating the structure of another conventional semiconductor package.
Figure 4:
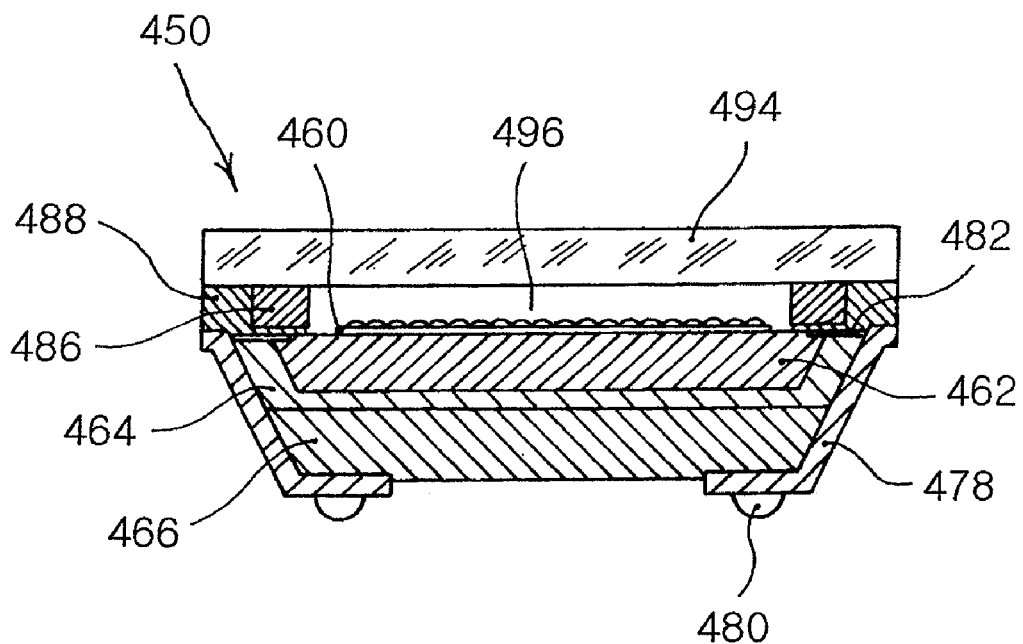
FIG. 4 is a longitudinal sectional view illustrating the structure of another conventional semiconductor package.
Figure 5:
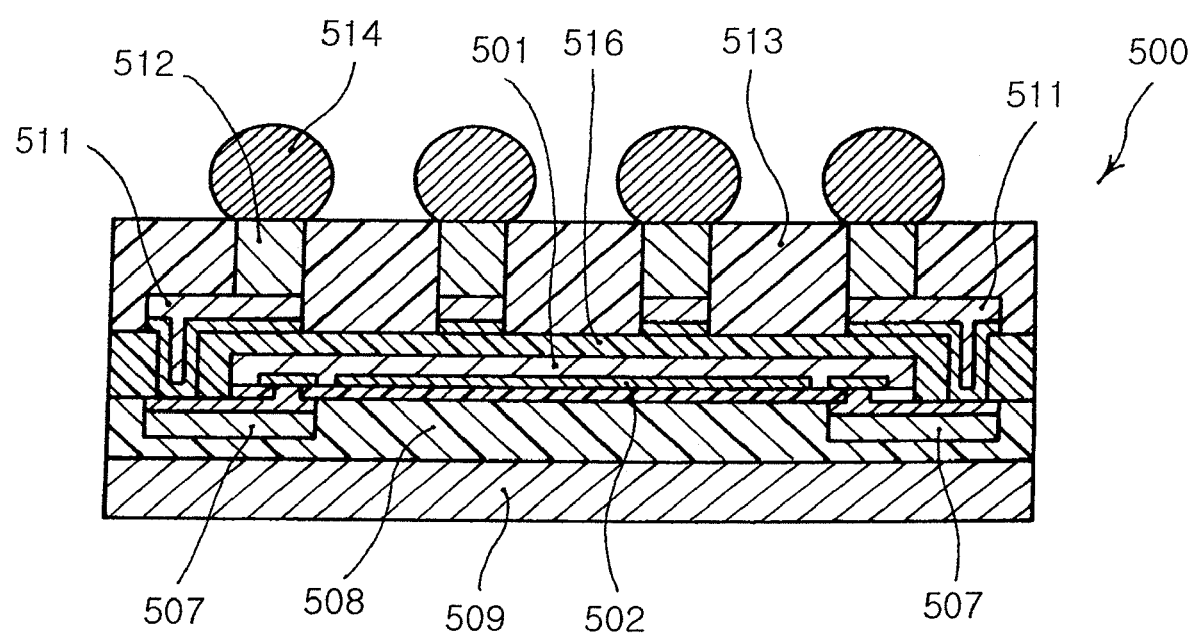
FIG. 5 is a longitudinal sectional view illustrating the structure of another conventional semiconductor package having bump electrodes.
Figure 6:
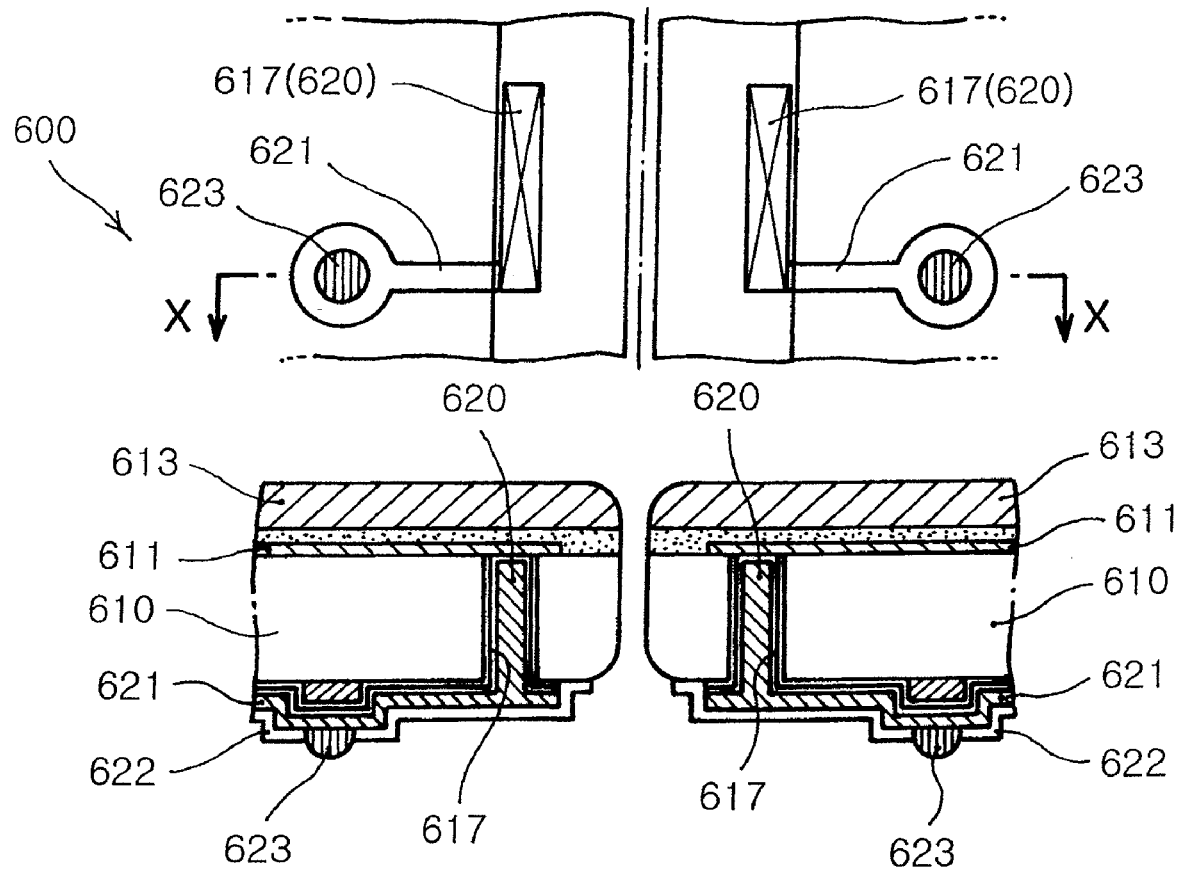
FIG. 6 is a longitudinal sectional view illustrating the structure of yet another conventional semiconductor package having a via hole.
Figure 7A:
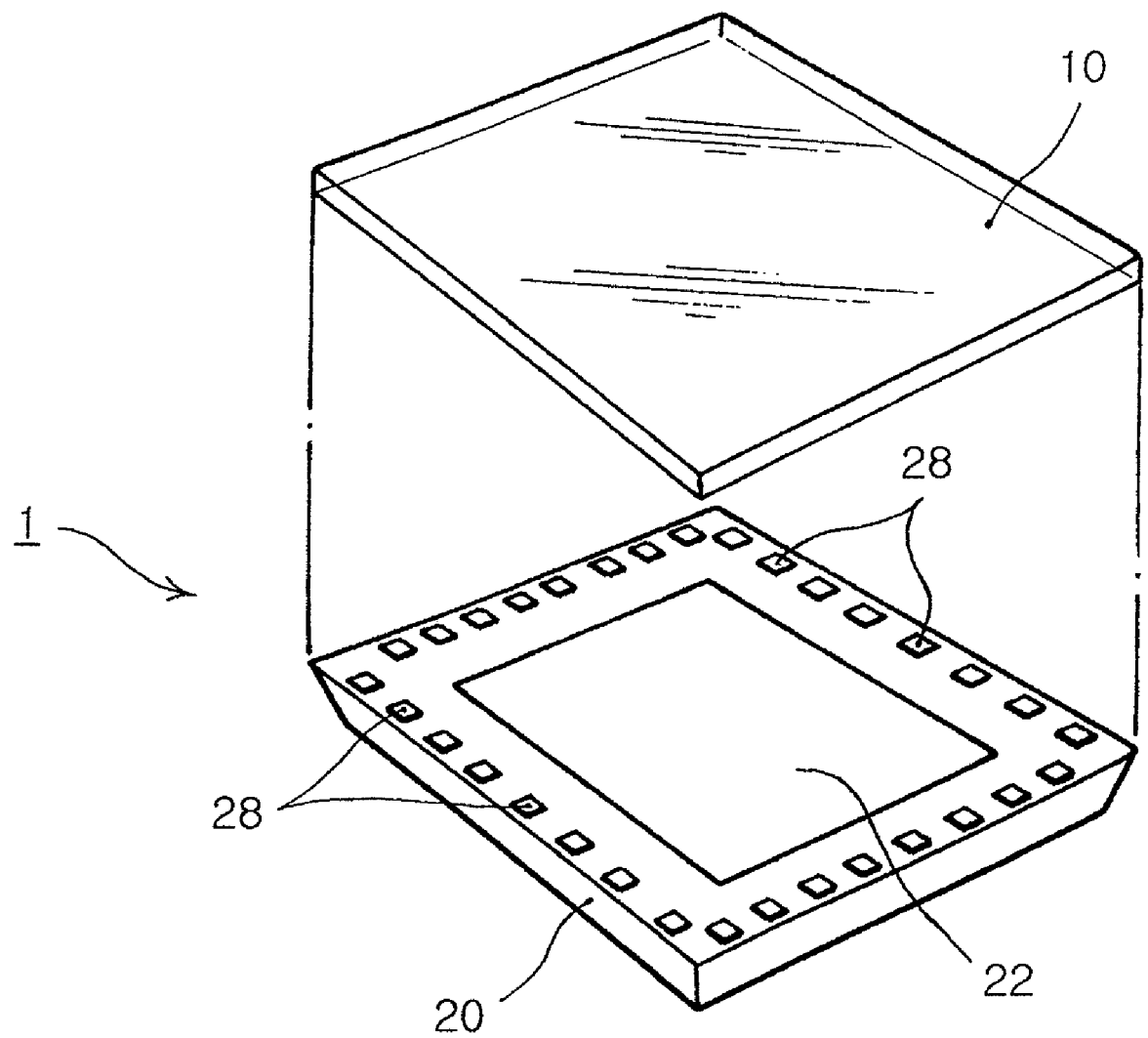
Figure 7B:
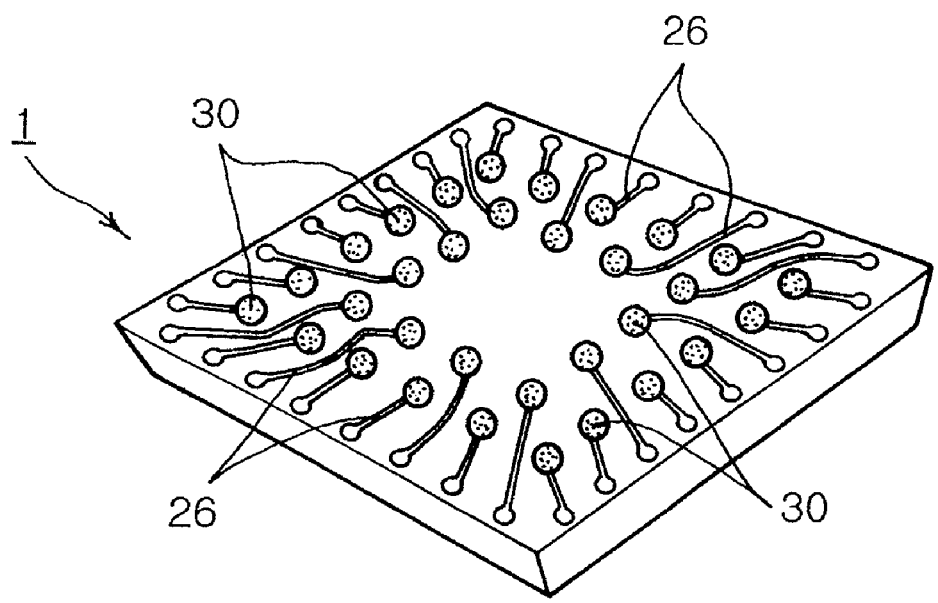
Figure 7C:
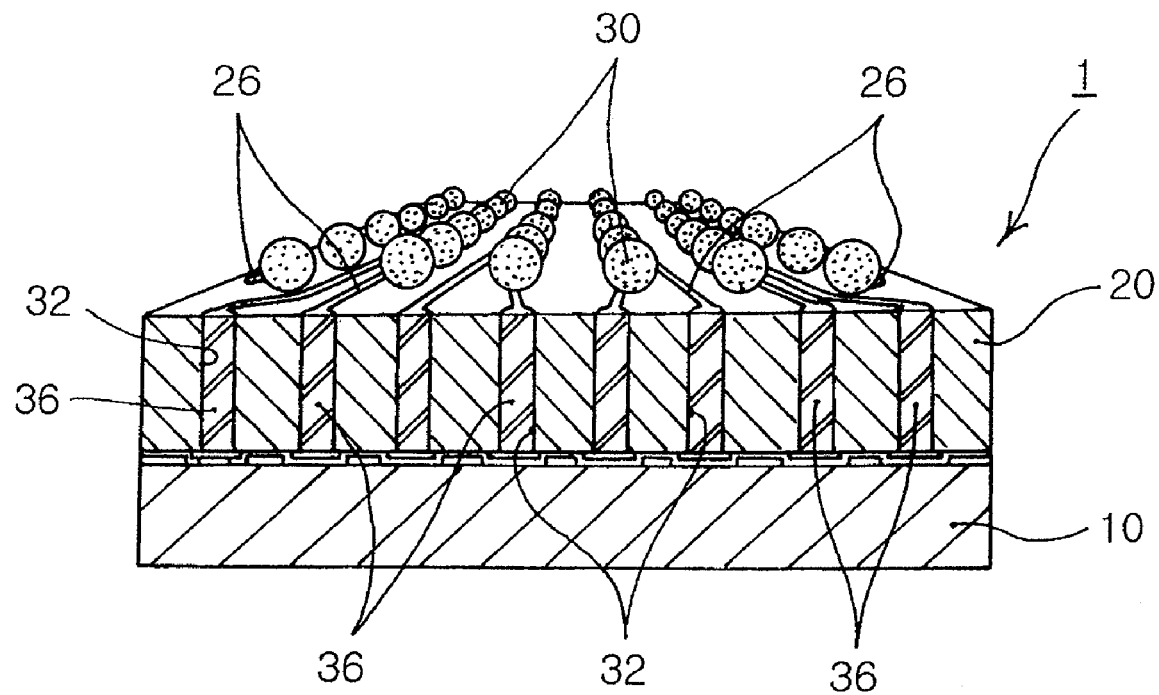

A semiconductor package 1 according to the present invention is illustrated in FIGS. 7A, 7B, and 7C. FIG. 7A is a perspective view of the semiconductor package 1 illustrating the front part of the semiconductor package 1, FIG. 7B is a perspective view of the semiconductor package 1 illustrating the rear part of the semiconductor package 1, and FIG. 7C is a longitudinal sectional view of the semiconductor package 1.

The semiconductor package 1 according to the present invention is manufactured in wafer level chip-on-package (CSP) mode. An infrared (IR) filter 10 is attached to the front surface of a wafer 20, which has an image sensor 22 formed at the center thereof. A circuit 26 is formed at the rear surface of the wafer 20, which is opposite to the image sensor 22, using a lead-redistribution technology, and solder ball-shaped bump electrodes 30 are disposed at the circuit 26 using a ball grid array technology.

As shown in FIG. 7A, the wafer 20 of the semiconductor package 1 according to the present invention is made of a silicon material having a predetermined size. At one side surface of the wafer 20 are formed pad electrodes 28, which are arranged along the edge of the wafer 20. The image sensor 22 is formed at the center of the one side surface of the wafer 20. In addition to the pad electrodes 28, an insulating layer 28$a$ (see FIG. 8B), which is composed of $SiN_3$ or $SiO_2$, is also formed.

Figure 8A:
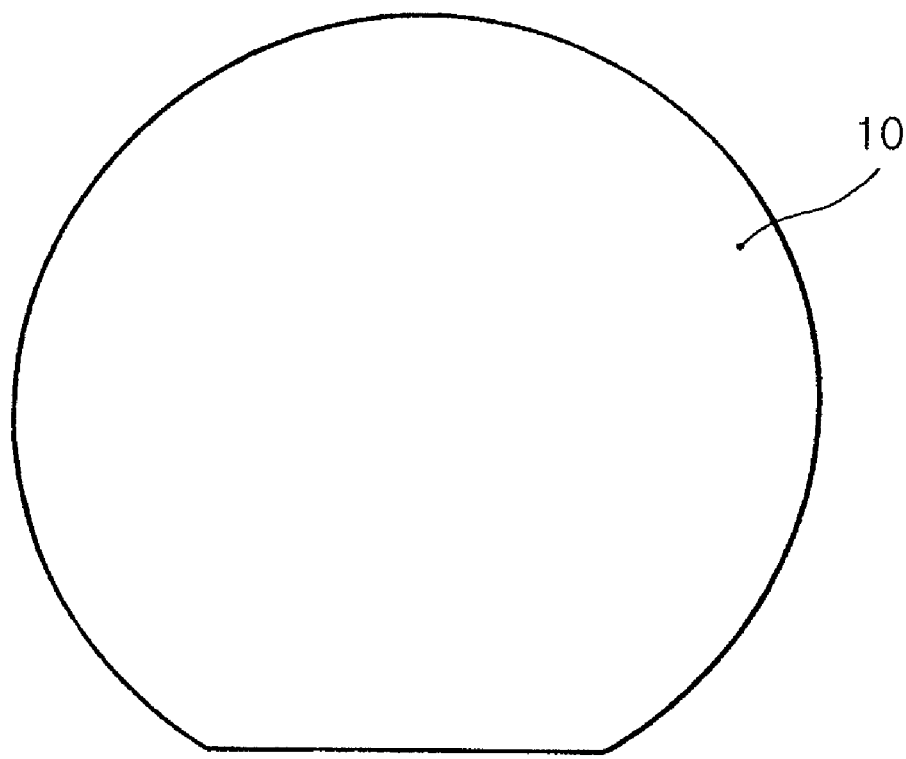
Figure 8B:
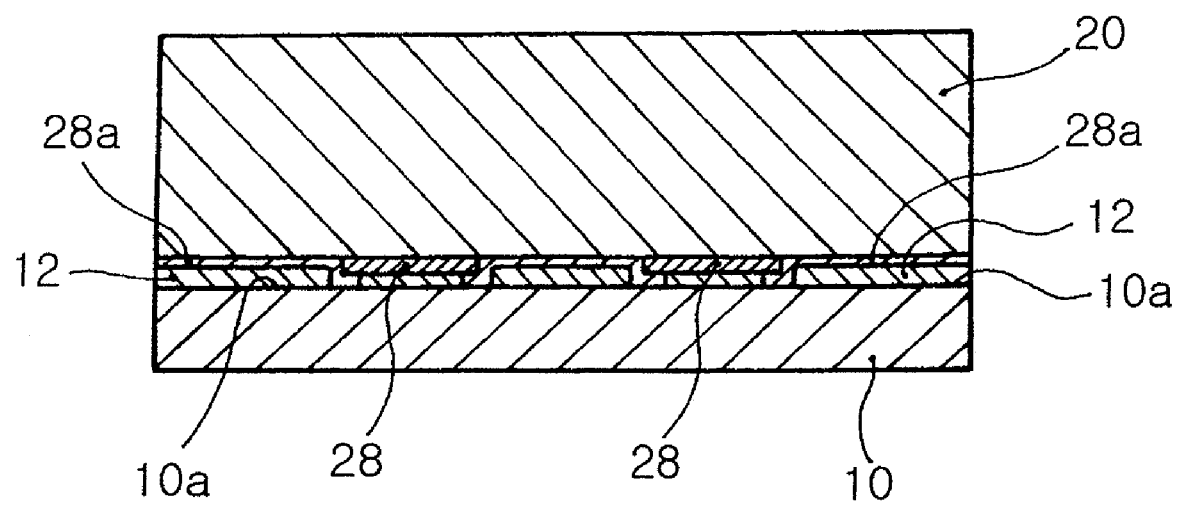

The IR filter 10 is attached on the pad electrodes 28 of the wafer 20 by means of a bonding agent 12 (see FIG. 8B). The IR filter 10 is obtained by processing a glass sheet in the form corresponding to the wafer 20 and performing IR coating on one side surface of the glass sheet. The coating surface 10$a$ (see FIG. 8B) may be formed at either the upper surface or the lower surface of the glass sheet. Preferably, the coating surface 10$a$ is formed at the glass sheet such that the coating surface 10$a$ is opposite to the wafer 20.

Preferably, the bonding agent 12, which bonds the IR filter 10 to the wafer 20 at the wafer level, is transparent and has excellent light transmissivity.

The semiconductor package 1 according to the present invention includes terminals 36 electrically connected to the pad electrodes 28, respectively, in via holes 32 formed at the other side surface of the wafer 20, which is opposite to the pad electrodes 28.

The via holes 32 are formed through the wafer 20 from the rear surface of the wafer 20 to the pad electrodes 28. The terminals 36, which are made of metal, are formed in the via holes 32, respectively.

As shown in FIGS. 7B and 7C, the terminals 36 constitute an electric circuit 26 at the rear surface of the wafer 20.

Also, the semiconductor package 1 according to the present invention includes bump electrodes 30, each of which is connected to one side of each of the terminals 36.

Each of the bump electrodes 30 are made of solder balls, which are provided for each of the terminals 36. As the bump electrodes 30 are formed at the rear surface of the wafer 20, the semiconductor package is mounted to a printed circuit board (PCB) using a generalized reflow mounting technology, and therefore, a light, thin, short, and small semiconductor package module is constructed.

In the semiconductor package 1 according to the present invention, the sum of the thickness of the wafer 20 and the thickness of the IR filter 10 attached to the wafer 20 by means of the bonding agent 12 corresponds to the normal wafer level, and therefore, the size of the semiconductor package 1 is minimized.

Now, a method of manufacturing the semiconductor package with the above-stated construction according to the present invention will be described in detail.

The method of manufacturing the semiconductor package according to the present invention includes a step of bonding the IR filter 10 onto the wafer 20, which has the pad electrodes 28 formed at one side surface thereof and is made of a silicon material.

At this step, as shown in FIG. 8A, a glass sheet is processed in the form corresponding to the wafer 20, and IR coating is applied to one side surface of the glass sheet to prepare the IR filter 10. In the conventional art, the glass sheet, preferably the rectangular glass sheet, is IR coated and is then cut into a plurality of IR filters 10, each of which is attached to a camera module. According to the present invention, on the other hand, the wafer-shaped IR filter 10 is integrally attached to the wafer 20, which is made of a silicon material, to manufacture the semiconductor package 1.

Next, as shown in FIG. 8B, the glass layer of the IR filter 10 is bonded onto the wafer 20 by means of the bonding agent 12. Preferably, the bonding agent 12 is transparent and has excellent light transmissivity.

The coating surface 10a may be formed at either the upper surface or the lower surface of the IR filter 10. Preferably, the coating surface 10a is formed at the IR filter 10 such that the coating surface 10a is opposite to one side surface of the wafer 20 where the pad electrodes 28 are formed. This is because the coating surface 10a is protected during the process.

The method of manufacturing the semiconductor package according to the present invention further includes a step of removing the rear part of the wafer 20 by cutting the rear part of the wafer 20 such that the sum of the thickness of the wafer 20 and the thickness of the IR filter 10 is within the initial thickness of the wafer 20.

Figure 9:
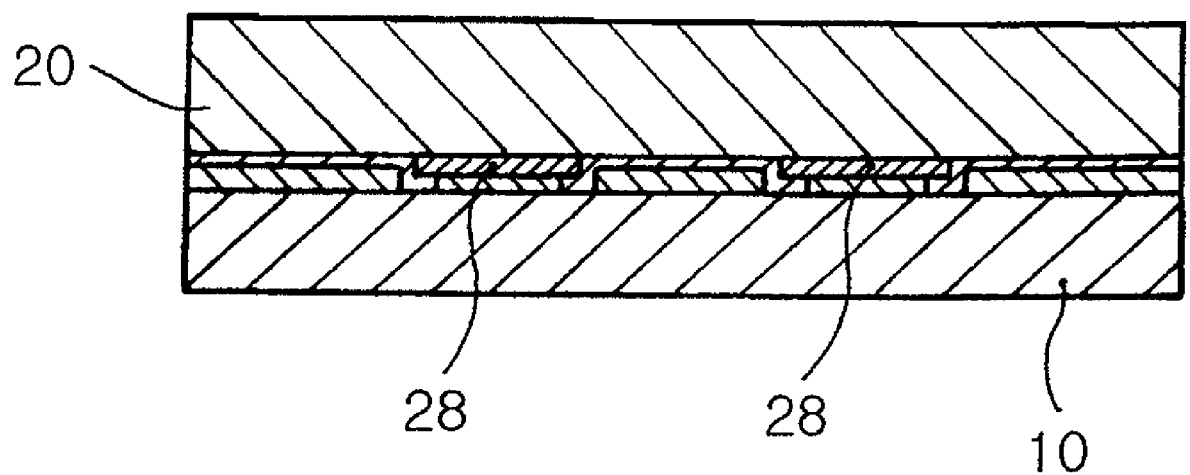
FIG. 9 is a sectional view illustrating a step of cutting the rear part of the wafer in the semiconductor package manufacturing method according to the present invention.

At this step, as shown in FIG. 9, the rear part of the wafer 20, to which the glass layer of the IR filter 10 is not attached, is removed to decrease the thickness of the wafer 20. Through this step, the wafer 20 is cut such that the thickness of the wafer 20 is minimized. Consequently, all of the conventional wafer processing facilities can be used at the following steps.

Furthermore, the size of the semiconductor package 1 is maintained at the level of the wafer 20, and therefore, a light, thin, short, and small semiconductor package module can be manufactured.

The method of manufacturing the semiconductor package according to the present invention further includes a step of forming via holes through the wafer 20 from the rear surface of the wafer 20 to the pad electrodes 28.

Figure 10:
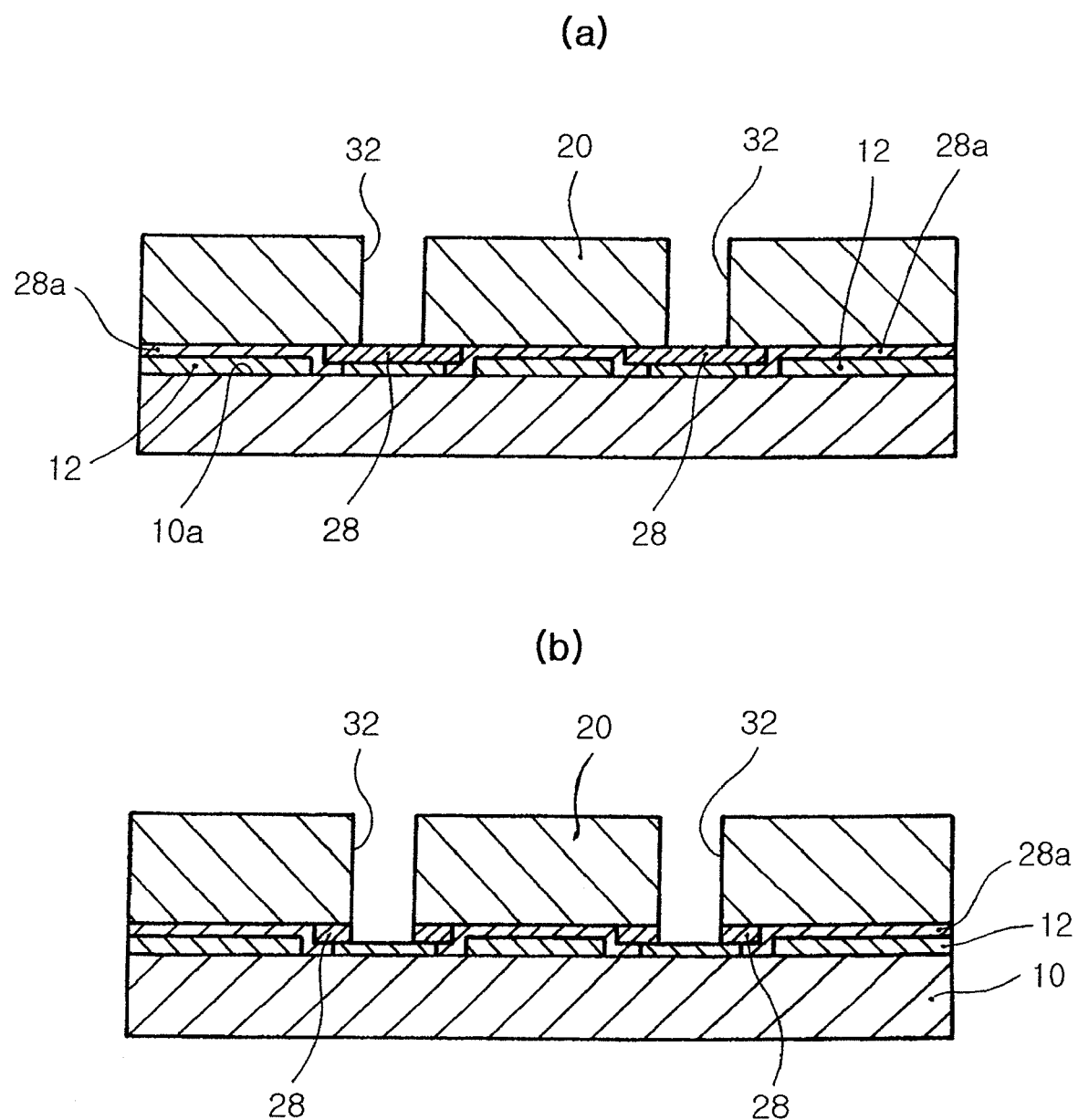

At this step, as shown in FIGS. 10A and 10B, the via holes 32 are formed at the wafer 20 where the pad electrodes 28 are disposed from the rear surface of the wafer 20 such that leads of the terminals 36 are redistributed on the rear surface of the wafer 20 at the level of the wafer 20. The via holes 32 may be formed in two methods, one of which is to form the via holes 32 by laser. The other method is to form the via holes 32 by dry etching.

When the via holes 32 are formed by general laser, the quality of the via holes 32 formed through the silicon wafer 20 is very poor. Also, heat is generated during the laser process, by which other problems may occur. For this reason, the present invention uses a microwave photon beam.

As shown in FIGS. 10A and 10B, the via holes 32 are formed using a femtosecond ($10^{-15}$ second) laser within a very short period of time. As a result, the inner walls or the surfaces of the via holes 32 are smoothly processed.

When the via holes 32 are formed using the femtosecond laser, the via holes 32 may be formed through the pad electrodes 28. Alternatively, the blind via holes 32, the depth of which reaches the pas electrodes 28, may be formed.

When the via holes 32 are formed using the dry etching, on the other hand, the via holes 32 are formed on the wafer 20 just once, and therefore, the mass production of the semiconductor package is easily accomplished. Using the dry etching process, the blind via holes 32, the depth of which reaches the pad electrodes 28, may be formed, as shown in FIG. 10A, or the via holes 32 may be formed through the pad electrodes 28, i.e., the through via holes 32 may be obtained, as shown in FIG. 10B. However, a process of forming the blind via holes 32, which are not formed through the pad electrodes 28 but the depth of which reaches the pad electrodes 28, will be described hereinafter in detail.

The method of manufacturing the semiconductor package according to the present invention further includes a step of forming the terminals 36 electrically connected to the pad electrodes 28 in the via holes 32.

Figure 11:
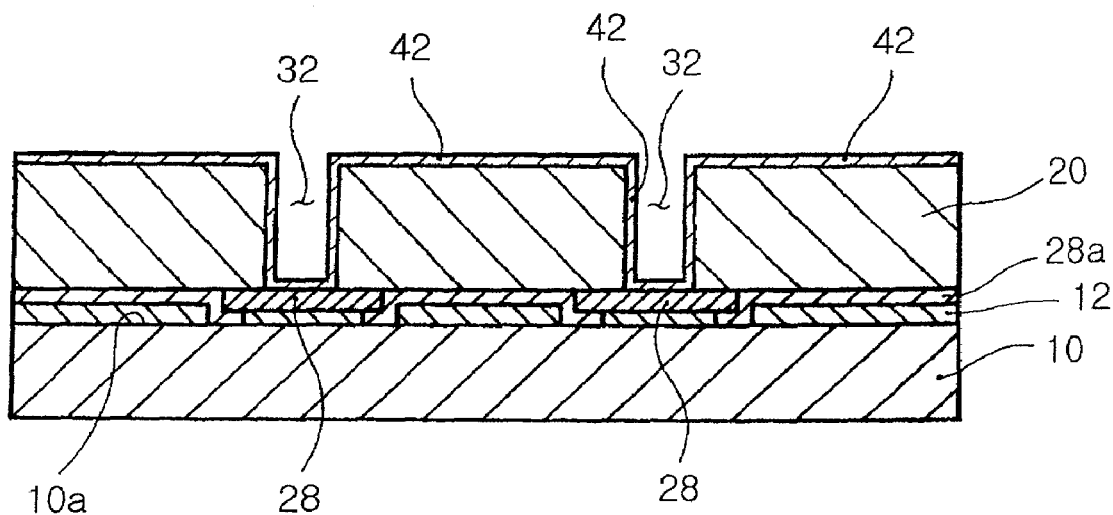
Figure 11:
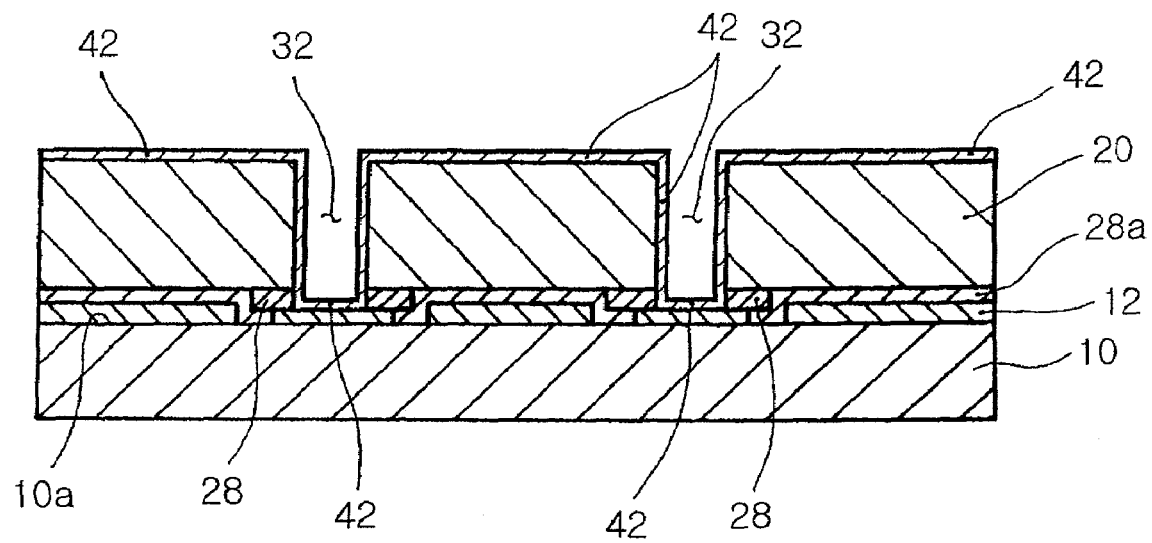
Figure 12:
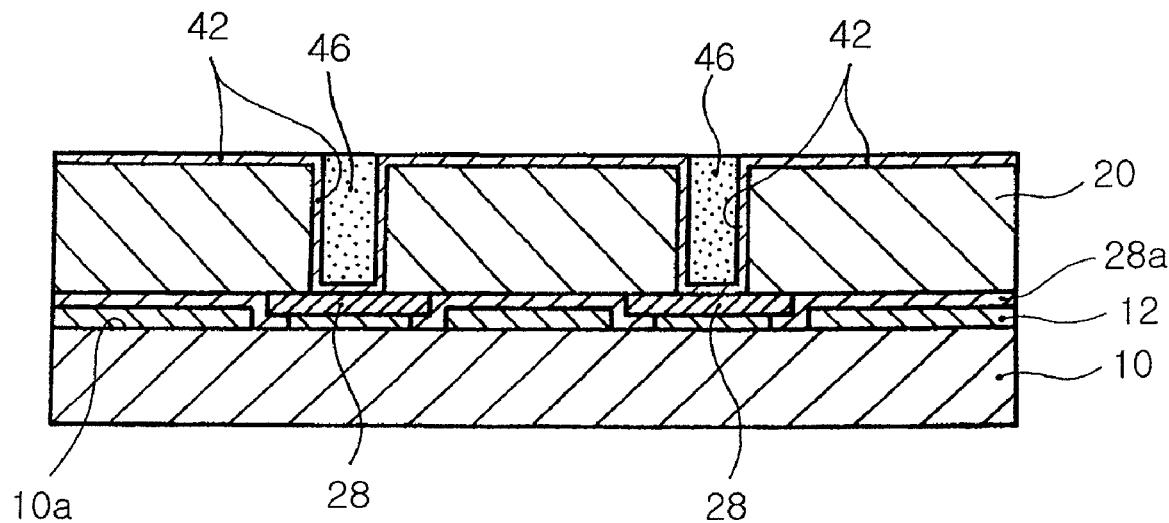
Figure 12:
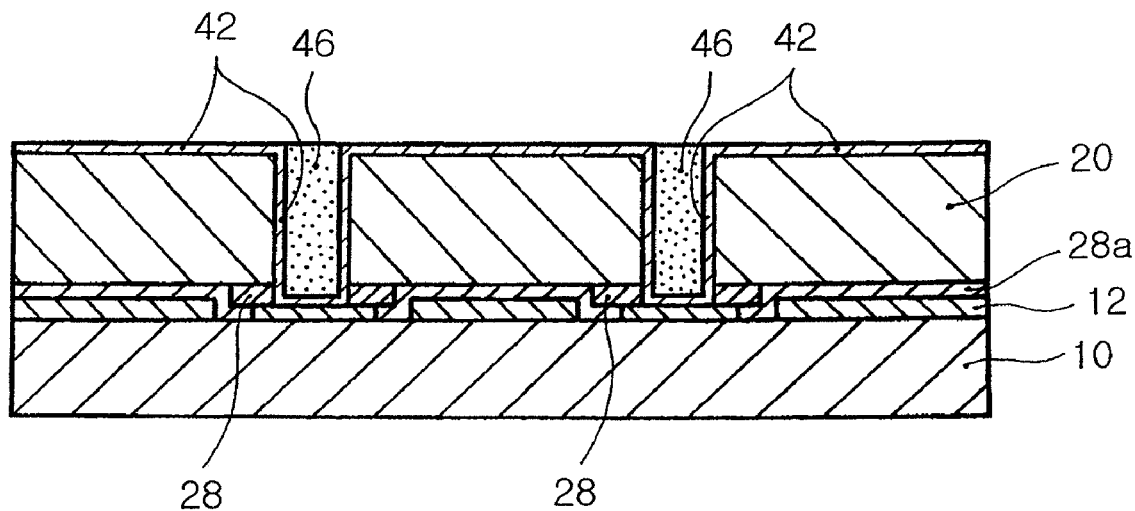

At the step of forming the terminals 36, a metal layer 42 is coated on the inner walls and the bottoms of the respective via holes 32, the depth of which reaches the pad electrodes 28 of the wafer 20, and the rear surface of the wafer 20. The metal layer 42 may be formed in various different fashions. For example, the metal layer 42 may be formed only by sputtering, as shown in FIGS. 11A and 11B. Alternatively, the metal layer 42 may be formed by sputtering and electric plating, as shown in FIGS. 12A and 12B.

The sputtering process may be performed using a source material, such as titanium (Ti), titanium nitride (TiN), or copper (Cu), and then the electric plating process using copper (Cu), i.e., the Cu electric plating process may be performed. According to the present invention, however, only the sputtering process is performed to form a multilayered metal layer, for example, a three-layered metal layer or a four-layered metal layer, within a short period of time, as shown in FIGS. 11A and 11B.

It takes approximately 67 minutes to plate the metal layer 42, the thickness of which is 5 micron, on the inner walls and the bottoms of the respective via holes 32 using the Cu electric plating process. Using the sputtering process according to the present invention, however, it only takes a few minutes to form the metal layer 42. Especially, the metal layer 42 formed by the above-mentioned sputtering process includes an adhesion layer, a barrier layer, a solder wettable layer in addition to a tantalum (Ta) layer, a tantalum nitride (TaN) layer, or a copper (Cu) layer, although the thickness of the metal layer 42 is very small. Consequently, the metal layer 42 serves as a barrier for preventing diffusion of the copper (Cu), and therefore, good results are obtained.

The sputtering coating process and electric plating process may be simultaneously performed as follows. As shown in FIGS. 12A and 12B, the via holes 32 are completely filled with metal by a full-fill plating process. However, it takes too much time to perform the full-fill plating process, and therefore, several attempts to reduce the time necessary to perform the full-fill plating process are being made. Alternatively, metal balls (not shown) may be placed at the upper parts of the via holes 32, and then the metal balls may be melted such that molten metal balls can be filled in the respective via holes 32.

According to the present invention, seed metal is formed at a predetermined region of the wafer 20, including the via holes 32, by sputtering at the level of wafer 20, and the respective via holes 32 is filled with conductive paste 46 by a metal printing process using a metal mask, in addition to formation of the metal layer 42 using only the sputtering process. This process enables the conductive paste 46 to be easily filled in the via holes 32, and therefore, mass productivity is increased.

According to the present invention, the metal layer 42 may be formed at the via holes 32 by sputtering, and then insulating material may be filled in the via holes 32 to protect the metal layer 42. The insulating material may be benzocyclobutene (BCB), polyimide (PI), or epoxy, which has low thermal expansion, high resistance to humidity, and excellent reliability.

The method of manufacturing the semiconductor package according to the present invention further includes a step of forming the circuit 26 at the rear surface of the wafer 20, which is performed after the completion of the step of forming the terminals 36.

At the step of forming the circuit 26, normal photosensitive resist is applied to the metal layer 42, and the circuit 26 is exposed using a mask, unnecessary parts are removed, and the metal layer 42 is etched to obtain the circuit 26.

Figure 13A:
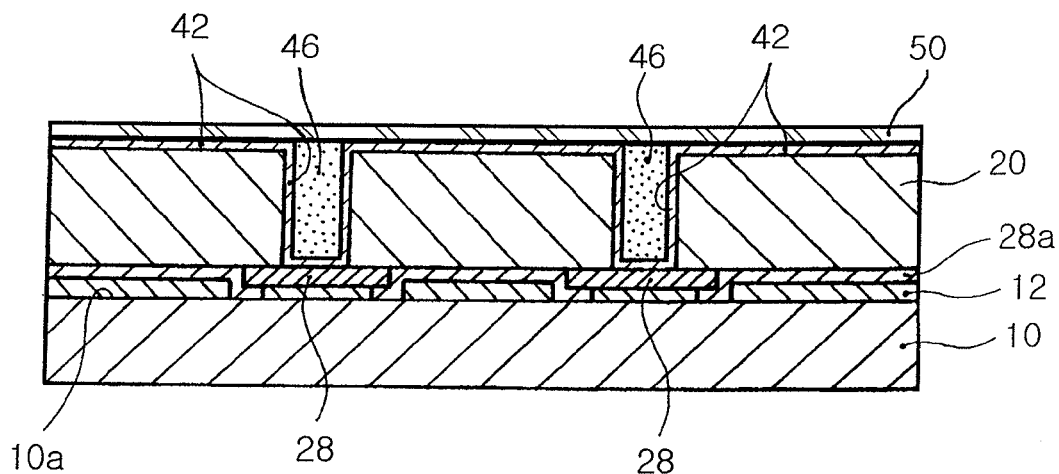
Figure 13B:
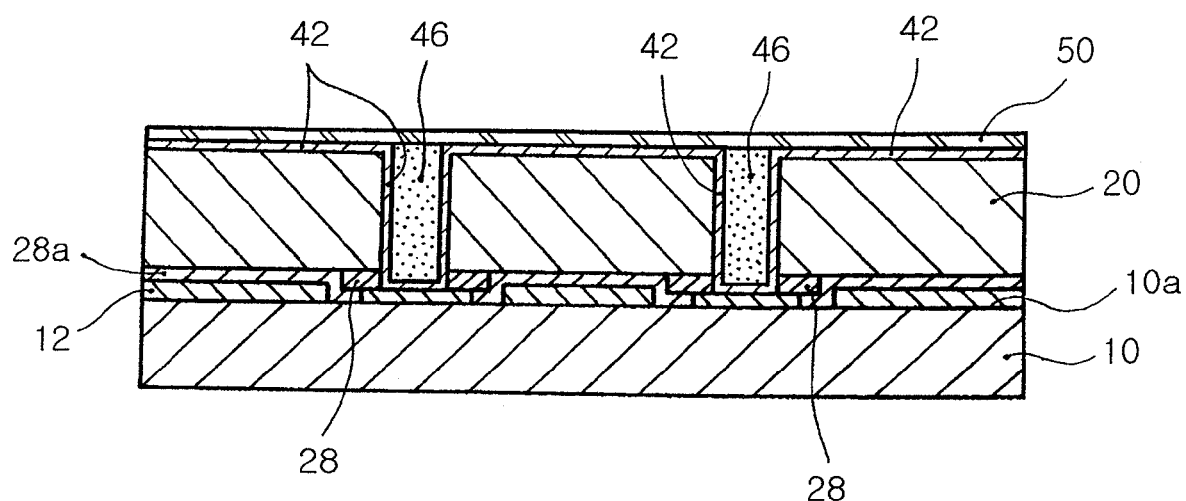
Figure 13C:
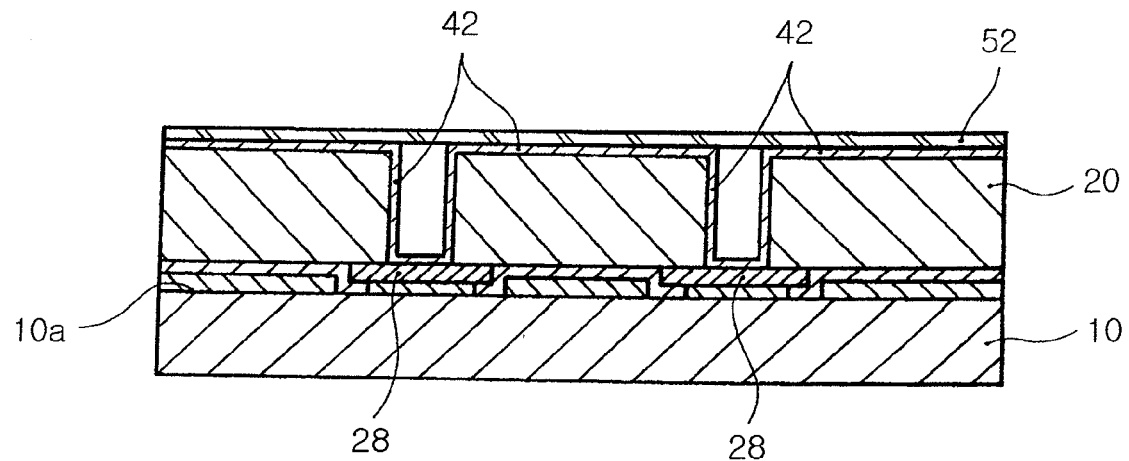
Figure 13D:
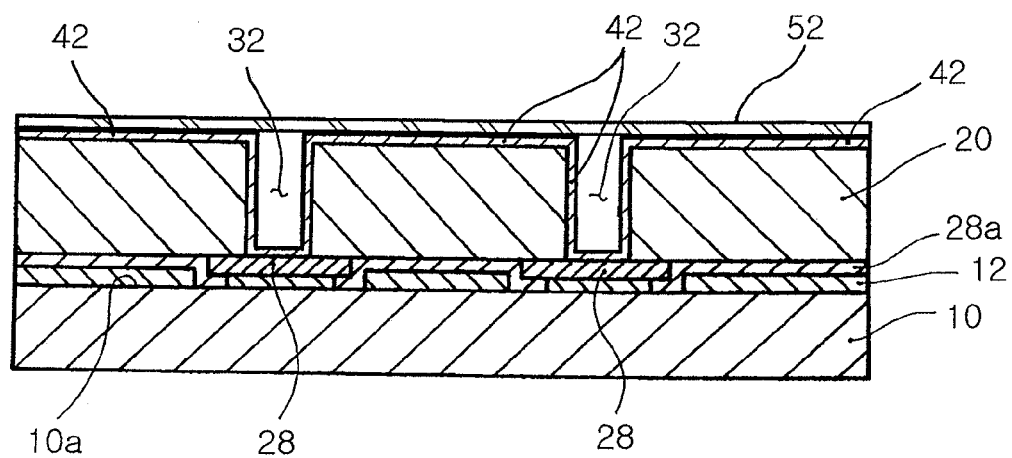

In the present invention, however, liquid-state photosensitive resist 50 is not used to form the terminal circuit 26, as shown in FIGS. 13A and 13B. According to the present invention, photosensitive film resist 52 is used to prevent the metal layer 42 coated on the inner walls and the bottoms of the via holes 32 from being etched and to prevent the via holes 32 from being contaminated due to foreign matter, as shown in FIGS. 13C and 13D.

The method of manufacturing the semiconductor package according to the present invention further includes a step of coating a protective layer 56 to protect the circuit 26. At this step, the circuit 26 is protected, and a positioning process for locating solder balls of the bump electrodes 30 is also performed.

At this step, the protective layer 56 is coated, an exposure process using a mask is performed to make the circuit 26 for locating the solder balls of the bump electrodes 30, unnecessary parts of the protective layer are removed, and a post hardening process is performed. Preferably, the protective layer for protecting the terminal circuit 26 may be made of a material, such as benzocyclobutene (BCB), polyimide (PI), or epoxy.

Figure 14:
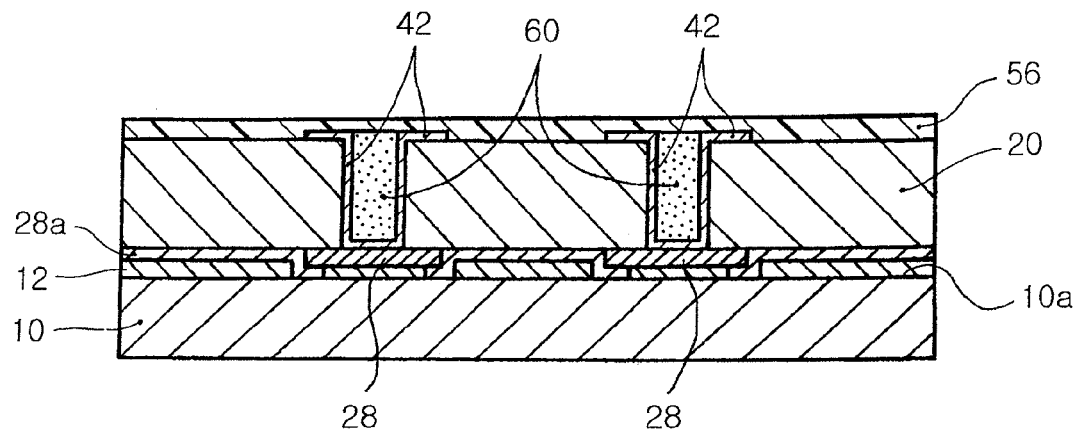
Figure 14:
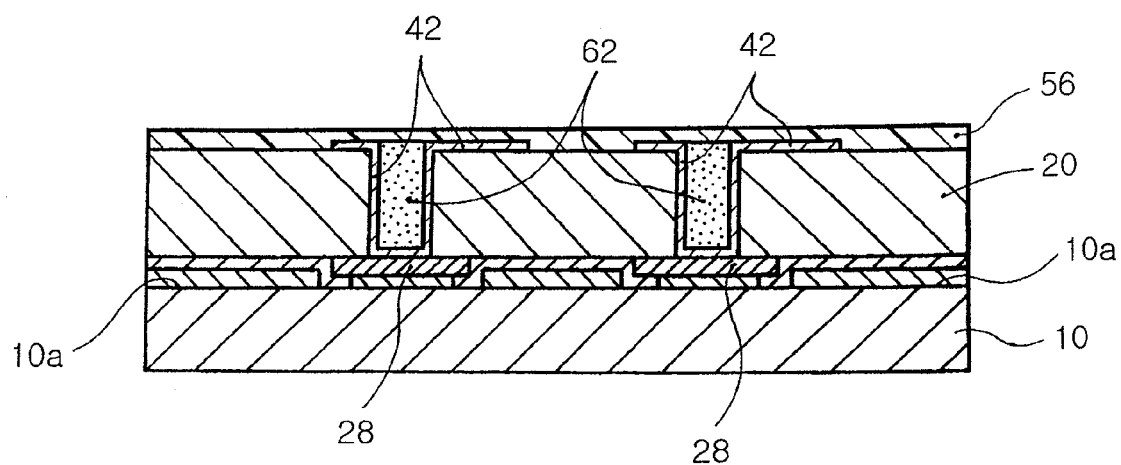

According to the present invention, the interiors of the via holes 32 are filled with protective film resist 60, as shown in FIG. 14A. Alternatively, the via holes 32 may be exposed in empty states.

In the process as shown in FIG. 14A, it is important to fill the via holes 32 with the protective film resist 60 and form the protective layer 56 having uniform thickness at the surface of the wafer 20.

At this step, as shown in FIG. 14B, the protective layer 56 is coated when the via holes 32 is filled with the conductive paste 46.

The method of manufacturing the semiconductor package according to the present invention further includes a step of forming the bump electrodes 30 on the terminals 36.

Figure 15:
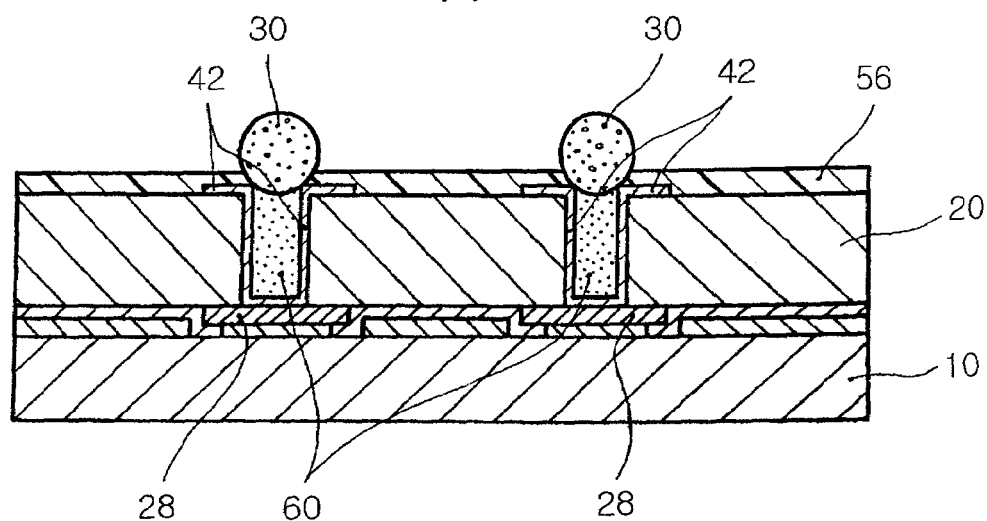
FIGS. 15A and 15B illustrate, in section, bump terminals formed at the terminals according to the present invention.
Figure 15:
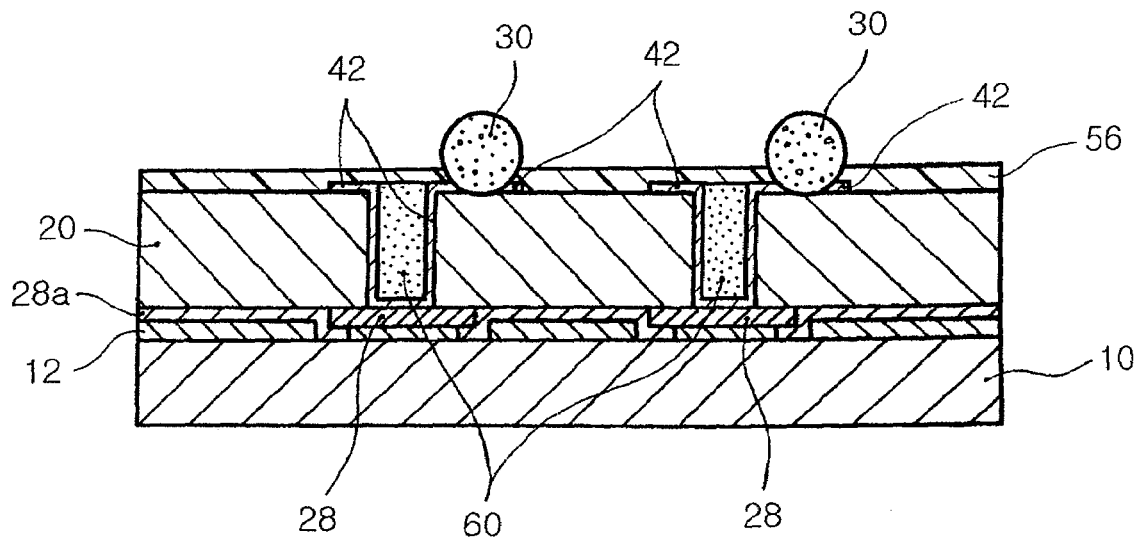

At this step, as shown in FIG. 15, the bump electrodes 30, each of which is composed of a solder ball, are formed. Solder ball forming methods are classified into a method of attaching the bump electrodes 30 to the metal layer 42, which constitute the terminals, a method of printing the solder paste, a method of forming the solder balls by sputtering, and a method of forming the solder balls by jetting. However, the important thing in this step is how much the manufacturing costs can be reduced and how much the quality and the reliability of the product can be improved.

When the bump electrodes 30 are made by the printing process, for example, the mask may be used in the case that the pitch of the solder balls is large, and the photosensitive film resist may be used in the case that the pitch of the solder balls is small.

As electronic equipment becomes lighter, thinner, shorter, and smaller, the pitch of the solder balls becomes smaller. Consequently, photosensitive film resist is preferably used.

Finally, the method of manufacturing the semiconductor package according to the present invention further includes a step of cutting a semiconductor package wafer 70 manufactured through the above-mentioned steps into a plurality of semiconductor packages 1.

Figure 16A:
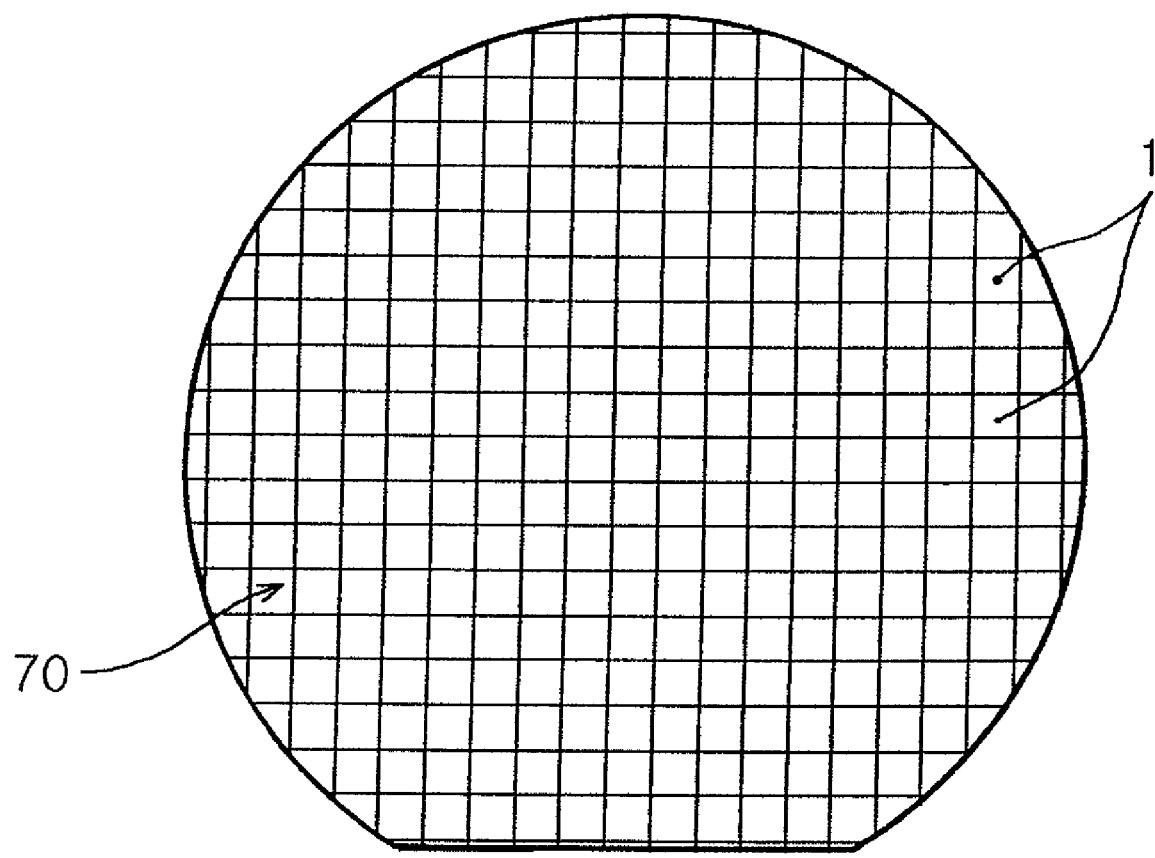
Figure 16B:
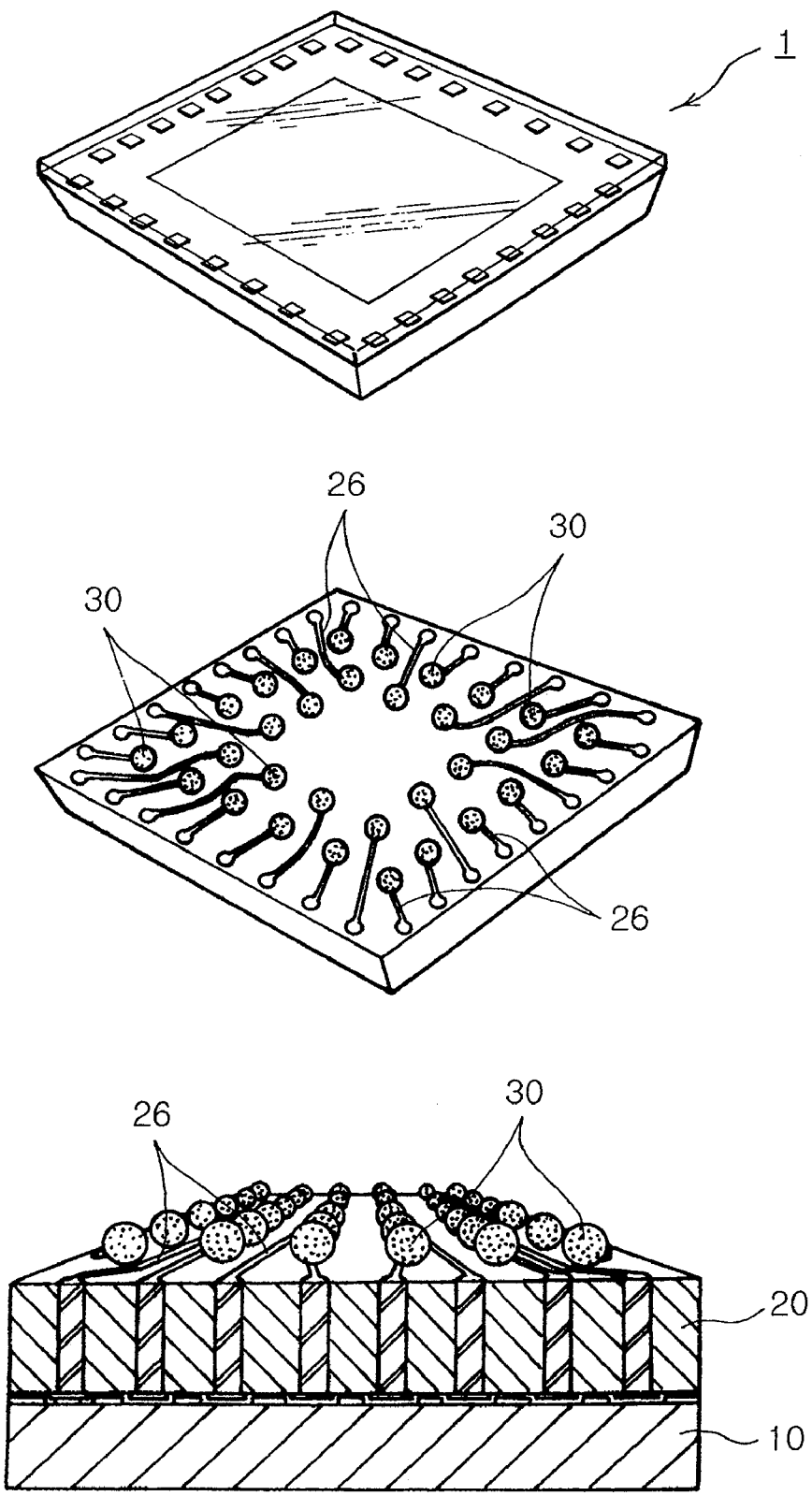

At this cutting step, as shown in FIG. 16A, the semiconductor package wafer 70 manufactured at the level of the wafer through the above-mentioned steps is diced into the plurality of semiconductor packages 1. As shown in FIG. 16B, each of the diced semiconductor packages 1 has the bump electrodes 30 formed at the rear surface thereof. Consequently, each of the semiconductor packages 1 can be easily assembled through a general reflow process at the step of assembling a camera module, and therefore, several steps may be omitted when the camera module is manufactured.

For example, the semiconductor package 1 according to the present invention includes the image sensor 22 and the IR filter 10, which are integrally attached to the semiconductor package 1. Consequently, steps of preparing the IR filter 10, such as a step of cutting the IR filter 10, a step of inspecting the cut IR filter 10, a bonding agent applying step, a step of attaching the IR filter 10, and an ultraviolet (UV) hardening step, may be removed or omitted.

Using the method of manufacturing the semiconductor package according to the present invention, the IR filter 10 can be attached to the wafer 20, while the level of the wafer 20 is maintained, to manufacture the semiconductor package 1. Consequently, the process of assembling the camera module is considerably simplified, the mass production of the semiconductor package is accomplished, and the manufacturing costs of the semiconductor package are reduced.

As apparent from the above description, the IR filter is attached to the semiconductor package. Consequently, the present invention has the effect of minimizing the size of the camera module, accomplishing the mass production of the semiconductor package, and reducing the manufacturing costs of the semiconductor package.

Furthermore, the semiconductor package is manufactured while the bump electrodes are previously formed at the rear surface of the semiconductor package. As a result, the semiconductor package can be easily mounted through a generalized reflow process when the semiconductor package is mounted to the printed circuit board of the camera module.

Consequently, the present invention has the effect of improving the productivity when the camera module is manufactured.

Moreover, the present invention enables the chip-on-package (CSP) mode manufacturing process to be considerably shortened. In addition, no additional IR filter is attached to the camera module. Consequently, the present invention has the effect of improving the manufacturing steps and thus improving productivity. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor package used in digital instruments, the method comprising the steps of:
    bonding an IR filter to a wafer, which has the pad electrodes formed at one side surface thereof and is made of a silicon material;
    removing the rear part of the wafer by cutting the rear part of the wafer such that the sum of the thickness of the wafer and the thickness of the IR filter is within the initial thickness of the wafer;
    forming via holes through the wafer from the rear surface of the wafer to the pad electrodes;
    forming terminals electrically connected to the pad electrodes in the via holes;
    forming bump electrodes on the terminals, respectively; and
    cutting the wafer into a plurality of semiconductor packages.

2. The method as set forth in claim 1, wherein the IR filter has a coating surface opposite to the surface of the wafer.

3. The method as set forth in claim 1, wherein the IR filter is processed in the form corresponding to the wafer, and the IR filter is composed of a glass sheet having an IR coating surface formed on the surface thereof.

4. The method as set forth in claim 1, wherein the step of forming the via holes is carried out using a microwave photon beam, i.e., a femtosecond laser.

5. The method as set forth in claim 4, wherein the via holes are through via holes, which are formed through the pad electrodes, or blind via holes, the depth of which reaches the pad electrodes.

6. The method as set forth in claim 1, wherein the step of forming the terminals is carried out to sputter a predetermined region of the wafer, including the via holes, and to form a three-layered or four-layered metal layer.

7. The method as set forth in claim 6, wherein the metal layer formed includes an adhesion layer, a barrier layer, and a solder wettable layer by having a tantalum (Ta) layer, a tantalum nitride (TaN) layer, or a copper (Cu) layer.

8. The method as set forth in claim 6, wherein the step of forming the terminals is carried out at the wafer level.

9. The method as set forth in claim 7, wherein the step of forming the terminals is carried out at the wafer level.

10. The method as set forth in claim 1, wherein the step of forming the terminals is carried out to form seed metal at a predetermined region of the wafer, including the via holes, by sputtering and to fill the respective via holes with conductive paste by printing.

11. The method as set forth in claim 10, wherein the step of forming the terminals is carried out at the wafer level.

12. The method as set forth in claim 1, wherein the step of forming the terminals is carried out to form a metal layer at a predetermined region of the wafer, including the via holes, by sputtering and to fill the respective via holes with insulating resin such that the metal layer is protected by the insulating resin.

13. The method as set forth in claim 12, wherein the step of forming the terminals is carried out at the wafer level.

14. The method as set forth in claim 12, wherein the insulating resin benzocyclobutene (BCB), polyimide (PI), or epoxy, which has low thermal expansion, high resistance to humidity, and excellent reliability.

15. The method as set forth in claim 14, wherein the step of forming the terminals is carried out at the wafer level.

16. The method as set forth in claim 1, wherein the step of forming the bump electrodes on the respective terminals is carried out using photosensitive film resist.

* * * * *